United States Patent [19]

Kinoshita et al.

[11] Patent Number: 4,910,588

[45] Date of Patent: Mar. 20, 1990

[54] IMAGE PICK-UP APPARATUS WITH HIGH RESOLUTION AND ANTI-BLOOM CHARACTERISTICS

[75] Inventors: Takao Kinoshita, Tokyo; Shinji Sakai, Yokohama; Yoshitake Nagashima, Chigasaki; Seiji Hashimoto; Akira Suga, both of Yokohama, all of Japan

[73] Assignee: Canon Kabushiki Kaisha, Tokyo, Japan

[21] Appl. No.: 382,026

[22] Filed: Jul. 19, 1989

Related U.S. Application Data

[63] Continuation of Ser. No. 319,819, Mar. 6, 1989, abandoned, which is a continuation of Ser. No. 73,913, Jul. 13, 1987, abandoned, which is a continuation of Ser. No. 658,608, Oct. 9, 1984, abandoned.

[30] Foreign Application Priority Data

Oct. 13, 1983 [JP] Japan .................................. 58-191404
Oct. 21, 1983 [JP] Japan .................................. 58-197752

[51] Int. Cl.[4] .............................................. H04N 9/07
[52] U.S. Cl. .......................................... 358/44; 358/43
[58] Field of Search ................ 358/41, 43, 44, 75, 358/213.19, 213.26, 213.29, 213.31; 357/24, 30

[56] References Cited

U.S. PATENT DOCUMENTS

Re. 30,800  11/1981  Yamanaka ............................ 358/44
3,777,061  12/1973  Takemura ............................ 358/44
4,001,878   1/1977  weimer ............................... 358/44
4,242,599  12/1980  Suzuki ........................... 358/213.19
4,320,413   3/1982  Takemura ............................ 358/44
4,334,239   6/1982  Herbst et al. ....................... 358/44
4,353,084  10/1982  Herbst et al. ....................... 358/44
4,367,492   1/1983  Harada et al. ....................... 358/44
4,392,154   7/1983  Horii ............................... 358/44
4,593,311   6/1986  Levine .............................. 358/43

FOREIGN PATENT DOCUMENTS 5919493  7/1982  Japan ................................ 358/44

Primary Examiner—James J. Groody
Assistant Examiner—Robert M. Bauer
Attorney, Agent, or Firm—Fitzpatrick, Cella, Harper & Scinto

[57] ABSTRACT

An image pick-up apparatus which has an image pick-up part, a color separating filter arranged in front of the image pick-up part, a driver, a storage part and a read out part. The image pick-up part includes a plurality of horizontal line sensors. The filter has a color repetitive pattern, having a predetermined period in the horizontal direction. The driver has a plurality of states, the successive assumption of which horizontally transfers information in each line sensor at a predetermined interval. The driver is structured and arranged to operate soo that such transfer is stopped intermittently during the transfer interval. The storage part temporarily stores information transferred horizontally from each line sensor, and the read out part sequentially reads out the information in the storage part, line by line.

22 Claims, 9 Drawing Sheets

IMAGE PICK-UP APPARATUS WITH HIGH RESOLUTION AND ANTI-BLOOM CHARACTERISTICS

This application is a continuation of application Ser. No. 319,819 filed Mar. 6, 1989, which is a continuation of Ser. No. 073,913, filed July 13, 1987, now abandoned, which is a continuation of Ser. No. 658,608, filed Oct. 9, 1984, now abandoned.

BACKGROUND OF THE INVENTION

1. Field of the Invention

The present invention relates to improvement of an image pick-up apparatus including a plurality of line sensors arranged horizontally.

2. Description of the Prior Art

Conventionally, to convert, for example, image information of one picture to a sequential signal of two fields, a method whereby an interline transfer type CCD or an MOS type sensor is used has been considered.

However, these sensors have a drawback of the deterioration of sensor sensitivity due to a small aperture ratio, because a transfer path, a gate and the like are formed in the photo sensing surface.

In addition, when considering such sensors from the viewpoint of the semiconductor manufacturing technology, there are drawbacks such that yield is bad and the number of pixels cannot be increased since a high degree of integration is needed.

In contrast, these drawbacks can be eliminated by use of a frame transfer type CCD. However, it is considered to be impossible for the frame transfer type CCD to convert the information of one image to a signal representing the information in sequence of two fields.

On the other hand, an image pick-up apparatus has been considered, constituted of a plurality of line sensors arranged horizontally, enabling the interlaced two-field signal to be derived by one image pick-up operation. However, in such a solid-state image pick-up device of the charge transfer type such as the CCD or like, when the strong light is incident on a part of the device, the charges generated overflow into the region of neighboring devices, causing the phenomenon called "blooming", such that the image could have been broken in a wide region on the image plane.

SUMMARY OF THE INVENTION

It is an object of the present invention to provide an image pick-up device which can solve such drawbacks of the conventional technologies as mentioned above.

Another object of the invention is to provide an image pick-up device having a high resolution in which blooming is less likely to occur than in conventional devices.

Still another object of the invention is to provide an image pick-up device which can easily separate the interlaced two-field image signal.

A further object of the invention is to provide an image pick-up apparatus with less color mixing.

To accomplish the above objects, an embodiment of the invention is provided with charge draining means among a plurality of pixels which are arranged like rows in a manner such that each charge draining means is provided for a plurality of rows. As a result, blooming can be suppressed without sacrificing the aperture ratio.

In addition, according to another aspect of the invention, the horizontal transfer is periodically stopped, corresponding to the horizontal period of the color filter, so that color mixing can be suppressed.

The above and other objects, features and advantages of the present invention will become apparent from the following detailed description with reference to the accompanying drawings.

DETAILED DESCRIPTION OF THE PREFERRED EMBODIMENTS

The present invention will now be described in detail hereinbelow with respect to the preferred embodiments.

Figure 1A:
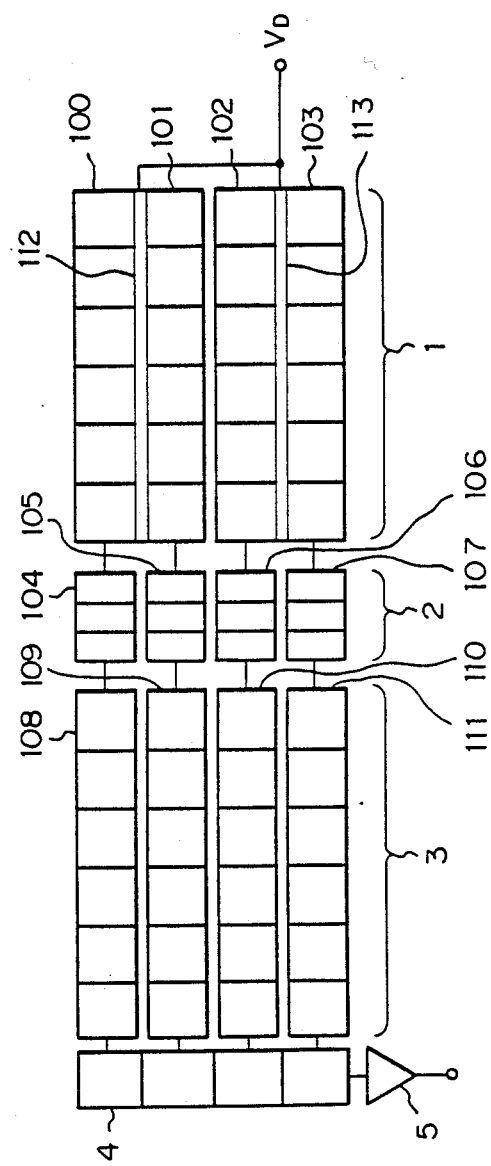
FIG. 1A is a diagram showing an arrangement of a first embodiment of an image pick-up device which is suitable for the present invention.

FIG. 1A is a diagram showing an example of an arrangement of an image pick-up device 6 which is suitable for an image pick-up apparatus of the invention.

Figure 1B:
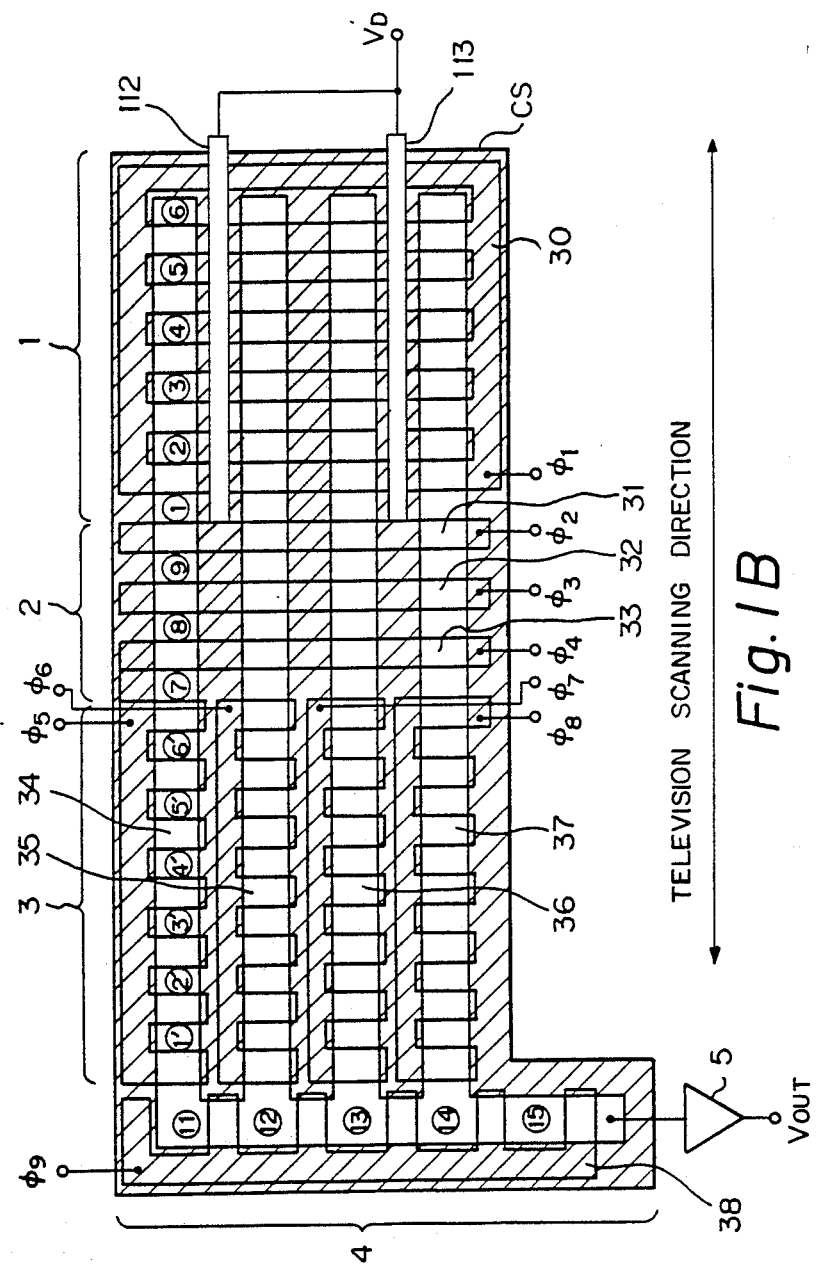
FIG. 1B is a diagram showing the electrodes of the image pick-up device of FIG. 1A.

FIG. 1B is a diagram showing an arrangement of the electrodes thereof. In the diagrams, a reference numeral 1 denotes an image pick-up part; 2 is a buffer part as buffer means; 3 is a storage part; 4 is a shift register having a CCD structure as a readout part; and 5 is an output amplifier. The portions other than the image pick-up part are shielded against the light. Storage part, or memory, 3 is preferably formed on a semiconductor chip together with the image pick-up part 1, and is disposed so as to charge-couple with the latter, either directly or through the buffer part 2. Such disposition of the memory relative to the image pick-up part is termed, throughout the specification and claims, "close" to the image pick-up part.

The image pick-up part 1 consists of a plurality of line sensors 100 to 103 having the transfer function which are arranged horizontally. The charges in each line sensor are simultaneously transferred to the left in FIG. 1B by a transfer electrode 30 disposed over a semiconductor substrate from which it is spaced by an insulating layer.

Each line sensor is isolated by a channel stop CS.

In addition, each line sensor has a structure such that a plurality of pixels having the photo-electric conversion function are arranged in the row direction in the embodiment; therefore, the image pick-up part has an arrangement whereby these pixels are arranged like a matrix in the row and column directions. In this embodiment, each pixel itself constitutes the transfer means, but the pixels and transfer means maya be individually constituted. In addition, in the diagram, the pixels are arranged like a matrix of four rows and six columns.

Overflow drains 112 and 113 are provided between the two rows of the line sensors each consisting of a plurality of pixels. Each overflow drain is arranged along the longitudinal direction of the line sensors.

Both of the overflow drains 112 and 113 are connected to a drain power source $V_D$. The channel stops which sandwich the overflow drain have the potential barrier structure which permits the overflow charges to flow out into the drain.

The buffer part 2 consists of line-like CCDs 104 to 107 for converting the time base. The number of CCDs is the same as the number of line sensors in the image pick-up part 1. In the embodiment, each line-like CCD has the capacity of three bits. The charges of each CCD in the buffer part 2 are transferred simultaneously bit by bit horizontally to the left in FIG. 1B by transfer electrodes 31 to 33.

The storage part 3 consists of line-like CCDs 108 to 111 arranged horizontally, i.e., in the same direction as those of the image pick-up part (hereinafter termed the "row direction"). The number of these CCDs is the same as that of the CCDs in the image pick-up part 1. The charges of each CCD are respectively independently transferred horizontally to the left (thus, in the row direction) in the diagram by transfer electrodes 34 to 37. Numeral 38 is a transfer electrode to vertically transfer the charges in the shift register 4 downward in the diagram (in the "column direction")

In the first embodiment, an example of the CCD structure of the single phase drive system is shown.

In addition, when a high-level voltage is applied to each transfer electrode, the potential level of the electrons in the substrate, particularly, the potential level under the electrode, relatively becomes low with respect to electron and a well is formed, thereby allowing the charges to be collected under each electrode.

When a low-level voltage is then applied to each transfer electrode, the potential level under the region covered by the electrode becomes higher than the potential level under the region not covered by the electrode, thereby permitting the charges that have already been collected so far under the transfer electrode to be transferred to the region not covered by the transfer electrode. As the regions that are covered or not covered by the transfer electrode have preferably respective potential slopes which substantially descend to the left, the charges are transferred to the left region not covered by the electrode.

$\phi_1$ to $\phi_9$ represent clock signals which are respectively supplied to the electrodes 30 to 38.

Figure 2:
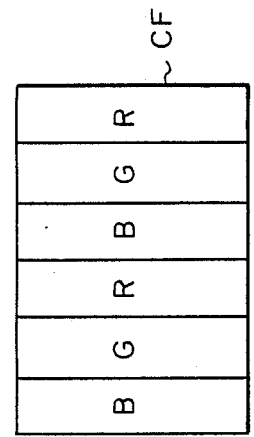
FIG. 2 is a diagram showing an example of a color separating filter.

As shown in FIG. 2, a color separating filter CF having, for instance, vertical stripe-like color filters is arranged on the surface of the image pick-up part 1. This color separating filter has a structure such that stripe-like color filters of B (blue), G (green) and R (red) are (repeatedly and horizontally) arranged in a horizontal series in accordance with this sequence, with a period of three filters (i.e., the pattern repeats every three filters). Further, a mosaic-like color separating filter which also has (a repetitive pattern of) color filters arranged in a two-dimensional pattern that is periodic both horizontally and vertically may be used in place of the strip-like color separating filter having such a horizontal repetitive pattern.

Figure 3:
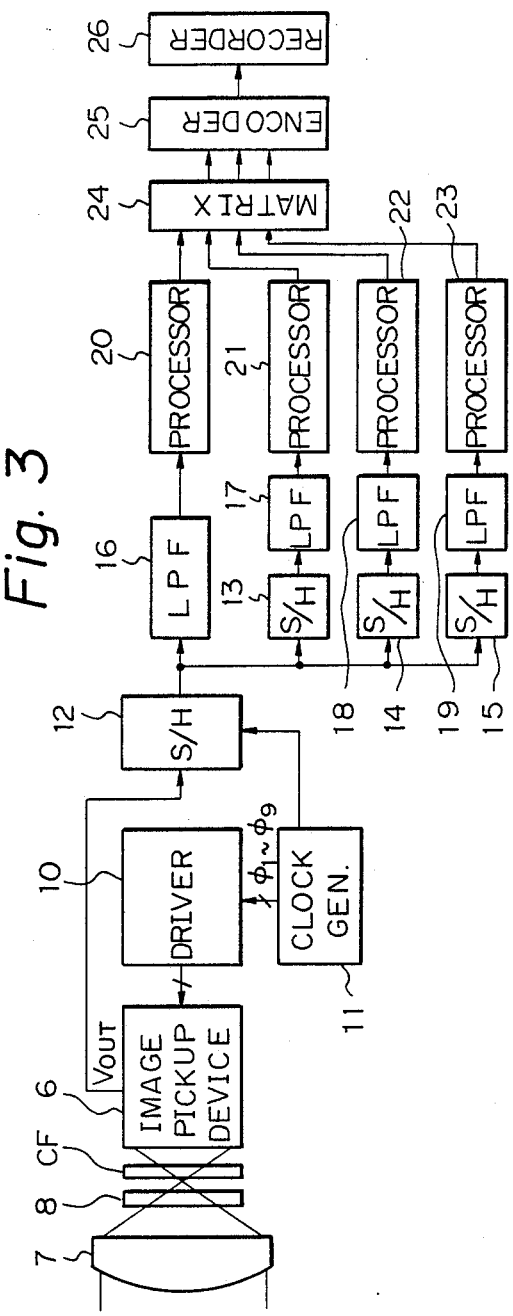
FIG. 3 is a diagram showing a first embodiment of an image pick-up apparatus using the image pick-up device shown in FIGS. 1A and 1B.
Figure 4:
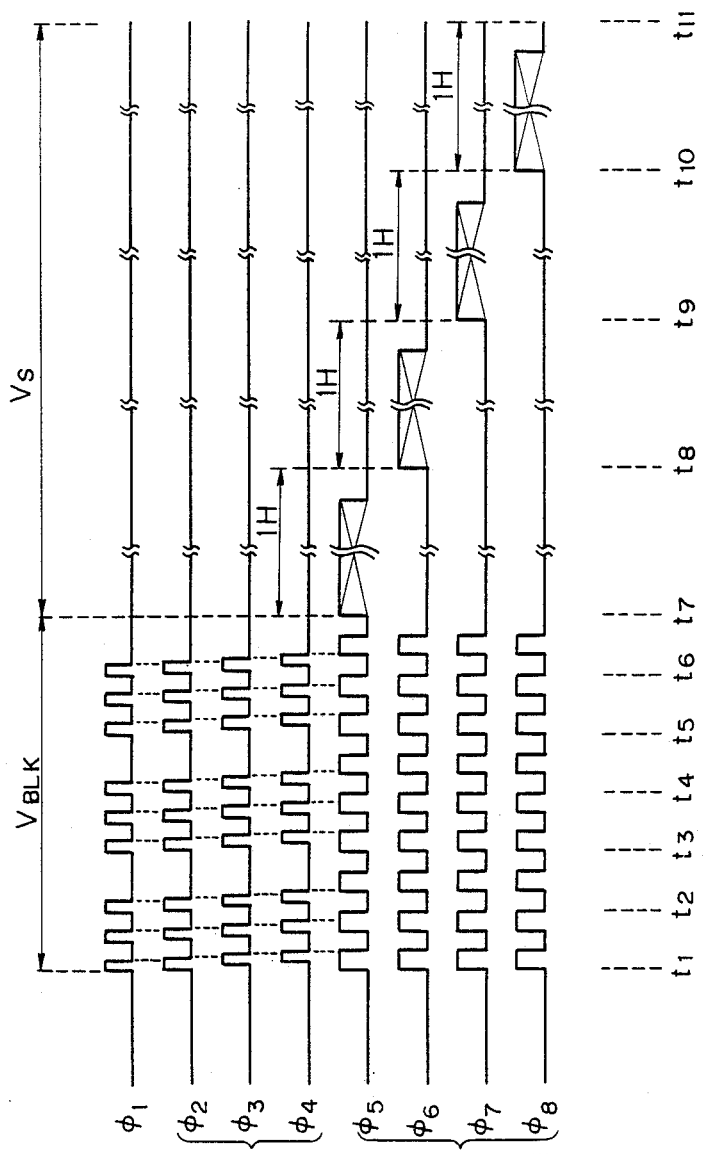
FIG. 4 is a timing chart of the image pick-up apparatus shown in FIG. 3.

FIG. 3 is a diagram showing an example of an arrangement of an image pick-up apparatus of the invention. The light from an object is formed as an image on the image pick-up device 6 through an image pick-up optical system 7, an infrared cutting filter 8 and the color separating filter CF. A numeral 11 denotes a clock generator of the invention. The outputs of the clock generator 11 which form the various kinds of clock pulses $\phi_1$ to $\phi_9$ as shown in FIG. 4, are properly amplified by a driver 10, then they are supplied to the image pick-up device 6. The clock generator 11 and driver 10 constitute the drive means.

Thus, the dot-sequential chrominance signal is outputted from the image pick-up device 6 as will be explained below.

This dot-sequential chrominance signal allows a sample and hold circuit 12 to raise the duty ratio and enables the sampling and holding operations for every color to be performed easily.

Numerals 13 to 15 are sample and hold circuits to perform the sampling and holding operations for every color as mentioned above. These sample and hold circuits sample the dot-sequential chrominance signal at the period corresponding to the color repetitive period of the color filters and in accordance with the phase of each color.

A low-pass filter 16 has a cut-off frequency of about, e.g., 3 MHz, while low-pass filters 17 to 19 respectively have a cut-off frequency of about, e.g., 500 KHz.

Processors 20 to 23 respectively perform various kinds of corrections such as the black level clamp, $\gamma$ correction, white clip, APC, etc. for the signals transmitted through the LPFs 16–19.

A matrix circuit 24 forms, for instance, a luminance signal Y and color difference signals R–Y and B–Y from the signals of Y, B, G, and R obtained through the processors 20 to 23.

An encoder 25 forms a standard television signal such as an NTSC signal by use of the above luminance signal and color difference signals.

A recorder 26 records this standard television signal.

Next, an example of the outputs of the clock generator 11 shown in FIG. 3 and the operation of the image pick-up device with the arrangement shown in FIG. 1 will be described in conjunction with FIG. 4.

In FIG. 4, $V_S$ denotes a vertical scanning interval of the standard television signal and $V_{BLK}$ indicates a vertical blanking interval. The clock generator 11 supplies the high speed clock pulse $\phi_1$ in the blanking interval $V_{BLK}$, thereby horizontally transferring the charges stored in the image pick-up part 1 to the left in FIG. 1B and allowing them to be temporarily stored in the storage part 3 through the buffer part 2.

As mentioned before, this horizontal transfer is carried out bit by bit whenever the voltage which is applied to each electrode is reduced to a low level after it has once been set at a high level.

Therefore, in the case of the image pick-up part having the pixels of six horizontal bits x four vertical bits as shown in FIG. 1, the transfer of one picture plane can be attained by supplying a 9-bit clock pulse as $\phi_1$ since each buffer part consists of three bits.

In this invention, when the charges in the image pick-up part 1 are transferred to the storage part 3 by the clock generator 11, the transfer operation is stopped during the time periods of $t_2$ to $t_3$, $t_4$ to $t_5$ and $t_6$ to $t_7$ in the interval $V_{BLK}$ for the purpose of horizontal transfer.

In the embodiment, the transfer operation is intermittently stopped at the period, namely, at every three bits corresponding to the horizontal color repetitive period of the color separating filter CF.

Consequently, for example, after the signal corresponding to R (red) stored at the position indicated at ⑥ in FIG. 1B was sequentially transferred to the positions →⑤→④→③, it is stopped at the position ③ for a relatively long interval. Thereafter, it is again transferred to the positions →②→②→⑨ and is further sequentially transferred to the positions →⑧→⑦→⑥'.

In this way, even during the horizontal transfer, the time when the charges remain at the positions of the same color filters becomes relatively long, while the time when the charges remain at the positions of the different color filters becomes relatively short; therefore, the charges corresponding to the different colors which are formed when the charges pass under the different color filters during the transfer interval relatively decrease.

Thus, in the image pick-up apparatus which includes the color repetitive pattern of a predetermined period in the direction perpendicular to the transfer direction of each line sensor of the image pick-up part, the color mixing during the transfer is relatively unlikely to occur, so that this makes it possible to raise the color reproducibility.

In addition, in the embodiment, the buffer part 2 is provided and the pulse $\phi_1$ including this intermittent transfer stop state is time-base converted by the delayed pulses $\phi_2$ to $\phi_4$ having predetermined widths so as to gradually become a pulse having a short stop interval. Therefore, in the storage part 3, the charges from the image pick-up part 1 can be received in response to the pulses $\phi_5$ to $\phi_9$ having relatively low frequencies.

The structure of the storage part is complicated in order to independently drive each line-like CCD and there is a case where the transfer efficiency decreases slightly. However, by providing the buffer part 2, there is no need to drive the storage part at a high speed and the transfer efficiency can be maintained.

The charges of the first row 108 among the charges stored in the storage part 3 in this way for the interval $V_{BLK}$ at a relatively low speed are read out by supplying the pulse $\phi_5$ in one horizontal interval of the next time period $t_7$ to $t_8$ and by supplying the pulse $\phi_9$. Then, the charges of the second row 109 are read out by supplying the pulse $\phi_6$ in one horizontal interval of the time period $t_8$ to $t_9$ and by supplying the pulse $\phi_9$. In the similar manner as above, the signals of one picture plane formed in the image pick-up part 1 are sequentially read out line by line.

The pulse $\phi_9$ is always being supplied at a high speed.

Also, as shown in this embodiment, in the present invention, since the overflow drains serving as the charge draining parts are horizontally provided in the image pick-up part 1 and thereby to horizontally transfer the charges in the image pick-up part, the horizontal resolution is not influenced at all. Moreover, since the bad influence does not affect the pixel pitch, there is less risk of occurrence of moire.

In addition, since each charge draining or eliminating part is provided for two rows consisting of a plurality of pixels, the reduction of effective photo sensing area can be suppressed to a relatively small degree.

The invention is also effective for improvement of the yield. On one hand, no problem is caused with respect to the vertical resolution because there is a limitation due to the number of horizontal scanning lines in the case of the standard TV system.

Figure 5A:
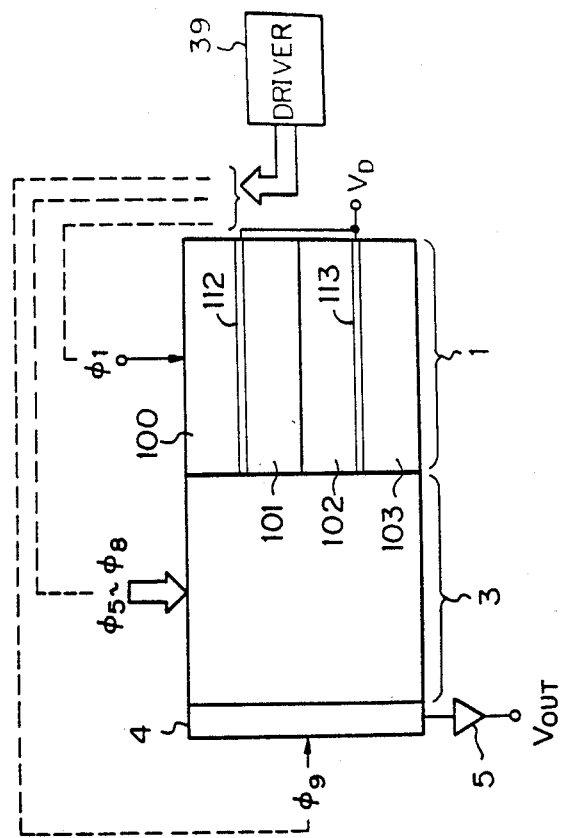
FIG. 5A is a diagram showing a second embodiment of an image pick-up apparatus according to the invention.

Next, FIG. 5A is a diagram showing a second embodiment of an image pick-up apparatus using the image pick-up device of the invention.

Figure 5B:
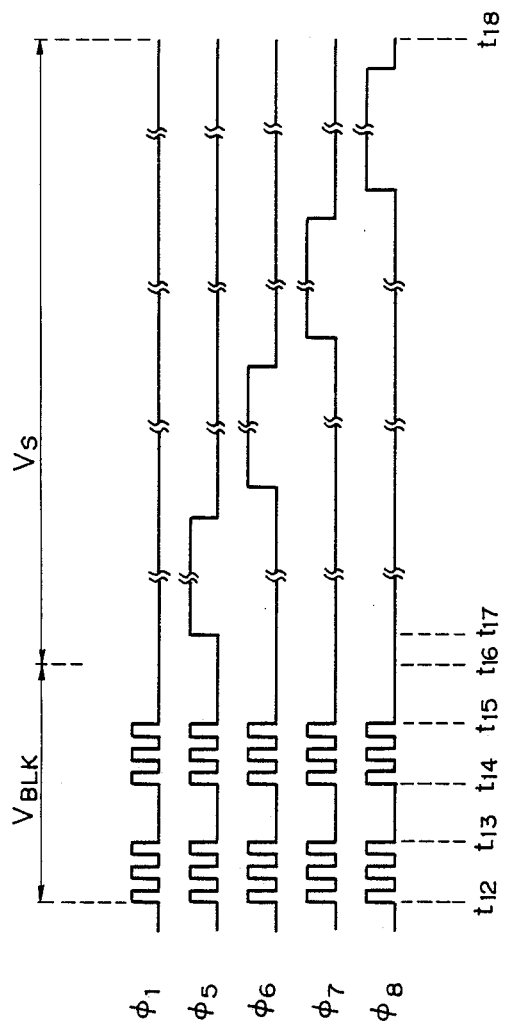
FIG. 5B is a timing chart thereof.

FIG. 5B is a timing chart thereof. In this embodiment, the structure is further simplified by omitting the buffer part in the image pick-up device shown in FIG. 1.

In these figures, the same parts and elements as those shown in FIGS. 1 to 4 are designated by the same reference numerals. Further, a reference numeral 39 denotes a driver to drive the image pick-up device, and 40 is a clock generator. The driver 39 and generator 40 constitute the drive means. As shown in FIG. 5A, in this embodiment, the structure is simplified compared to the first embodiment and the yield can be improved since the buffer part 2 is omitted. Numerals 112 and 113 represent the overflow drains as the charge draining part. Each overflow drain is horizontally provided for two rows consisting of a plurality of pixels of the image pick-up part 1. The drains 112 and 113 are together connected to the drain power source $V_D$. In this embodiment as well, the filter CF shown in FIG. 2 is disposed on the image pick-up part 1.

Next, the operation of the clock generator 40 of the embodiment will be explained with reference to the timing chart shown in FIG. 5B.

For the interval $V_{BLK}$ of the time period $t_{12}$ to $t_{16}$, the charges of each line sensor in the image pick-up part 1 are horizontally transferred to the line-like CCDs corresponding to the storage part 3 in response to signals $\phi_1$, $\phi_5$ to $\phi_8$ each having six pulses. At this time, since the transfer operation is intermittently stopped at time periods $t_{13}$–$t_{14}$ and $t_{15}$–$t_{16}$ in this embodiment, the color mixing is unlikely to occur, as in the case of the foregoing first embodiment. Further, in this embodiment, since the number of pulses necessary for the horizontal transfer is small and the pulse to drive the buffer part 2 is omitted, the arrangement of the clock generator 40 is simplified. In addition, since the charges of the image pick-up part 1 are stored in the storage part 3 until the time $t_{16}$, the pulses $\phi_5$ to $\phi_8$ to read out the charges which are similar to those in the embodiment shown in FIG 4, are supplied from the clock generator 40 for the vertical scanning interval of the time period $t_{17}$–$t_{18}$. Although the pulse $\phi_9$ is not shown in FIG. 5B, it is likewise always being supplied as a high speed pulse.

In addition, although an example whereby the transfer operation is intermittently stopped upon the horizontal transfer in the first and second embodiment has been shown, even in the case where a color separating filter having a repetitive pattern in the vertical direction is used in a general frame transfer type CCD or an interline type CCD also, if the transfer operation is intermittently stopped upon the vertical transfer, a similar effect of prevention of the color mixing as in the foregoing embodiments of the present invention will be derived.

Therefore, the invention is also obviously applicable to such an arrangement as mentioned above.

Figure 6:
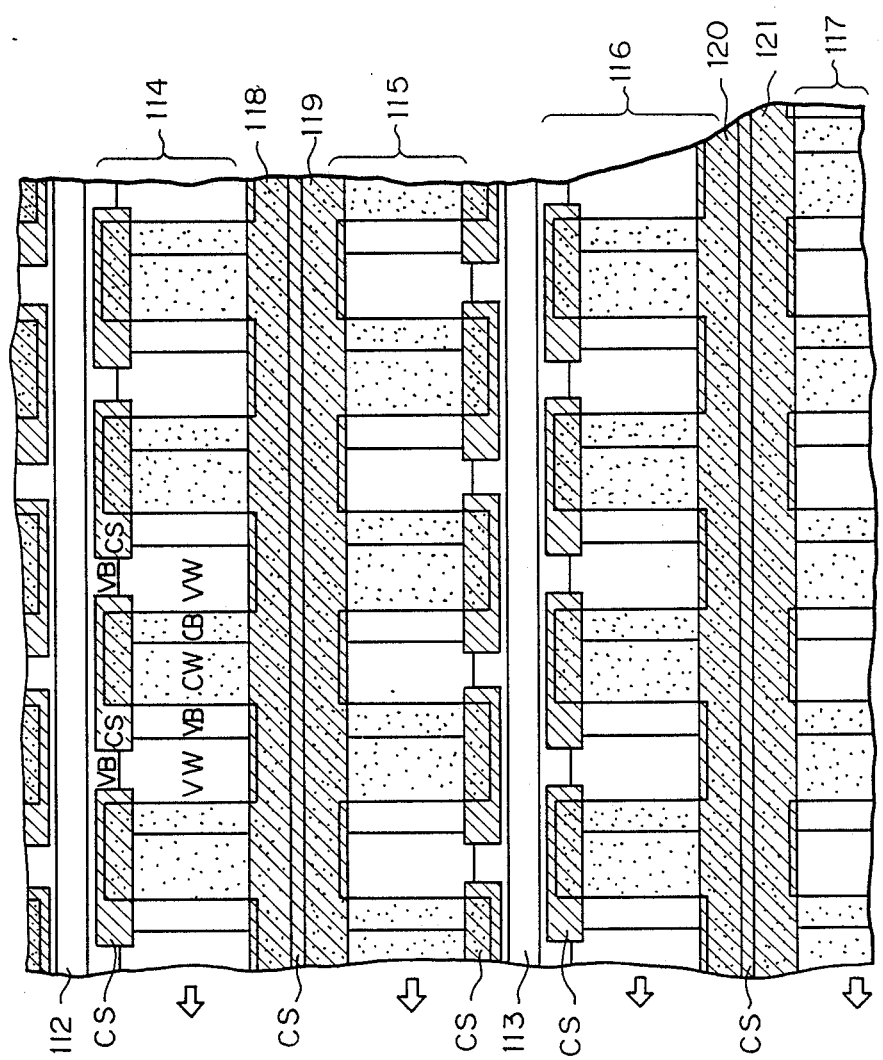
FIG. 6 is a diagram showing s third embodiment of an image pick-up device of the invention.

Next, FIG. 6 is a diagram showing a third embodiment of an image pick-up device of the invention. This embodiment relates to a modified form of the electrode arrangement of the image pick-up part 1 of FIGS. 1A and 1B or FIG. 5A. The image pick-up part in this embodiment has a similar arrangement to that in FIGS. 1A and 1B or FIG. 5A with respect to the point whereby a plurality of horizontal line sensors are vertically arranged. A first feature of the embodiment is that each horizontal line sensor is driven by an independent transfer electrode, respectively. That is, numerals 114 to 117 indicate horizontal line sensors, and 118 to 121 are electrodes to perform the horizontal transfer of the line sensors 114 to 117, respectively. A mutually independent voltage is supplied to each electrode 118 to 121. In the diagram, the hatched portions CS where the oblique lines on the left side fall represent the channel stops.

The structure shown is described in accordance with the single-phase drive system using virtual electrodes as disclosed in U.S. Pat. No. 4,229,752.

In FIG. 6, VB and VW respectively indicate virtual electrode parts having predetermine fixed potential levels. The potential level regarding the electrons in the VB is higher than that in the VW. CB and CW also respectively represent variable potential region parts having predetermined potential levels. These variable potential parts are arranged under the transfer electrodes and their potential levels respectively increase and decrease in dependence upon a low level and a high level of the potential which is applied to the electrodes. Even in this case also, the potential level regarding the electrons in the CB is higher than that in the CW. In the state whereby a high-level voltage is applied to the transfer electrodes, the potential level in the CB region is lower than that in the VW region. On the other hand, in the state whereby a low-level voltage is applied to the transfer electrodes, the potential level in the VB region is lower than that in the CW region. Therefore, in the state whereby a low-level voltage is first applied to each transfer electrode, the charges are collected in the VW region of each cell and when a high-level voltage is then applied to the transfer electrodes, whereas the potential level of the channel stop CS doesn't vary, the charges in each cell are transferred to the CW region to the left in the diagram. Subsequently, when the voltage to be applied to the electrodes is reset at a low level, the charges are transferred to the VW region of the next cell on the left side.

In this embodiment, as described above, while the voltage to be applied to the transfer electrodes is set at a low level, or when it is reduced from a high level to a low level, the charges which exceed the potential level in the VB region among the charges collected in the VW region flow into the overflow drains 112 and 113 serving as the charge draining parts, so that they are drained. Therefore, the problem of blooming is completely solved.

In addition, since each pixel is shifted horizontally by ½ of the pixel with regard to the rows of the adjacent pixels in the embodiment, the resolution can be improved.

Figure 7:
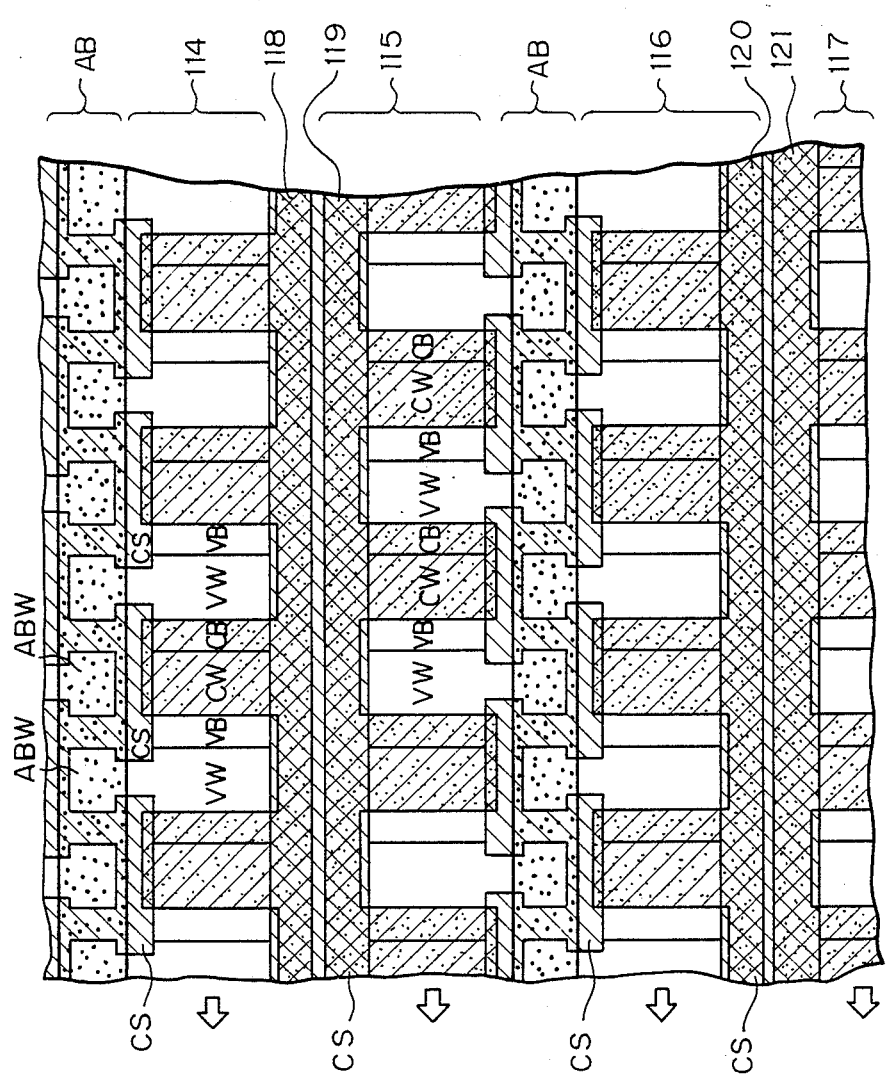
FIG. 7 is a diagram showing a fourth embodiment of the same.

FIG. 7 is a diagram showing a fourth embodiment of an image pick-up device of the invention and illustrates a modified form of the electrode arrangement of the image pick-up part 1 of FIGS. 1A and 1B, or FIG. 5A. This embodiment is also similar to the third embodiment with respect to the points that a plurality of horizontal line sensors are vertically arranged in the image pick-up part and each horizontal line sensor is respectively driven by the electrically independent transfer electrodes.

A feature of this embodiment is that each charge recombination electrode acts as the charge draining part for two rows consisting of a plurality of pixels.

Figure 8:
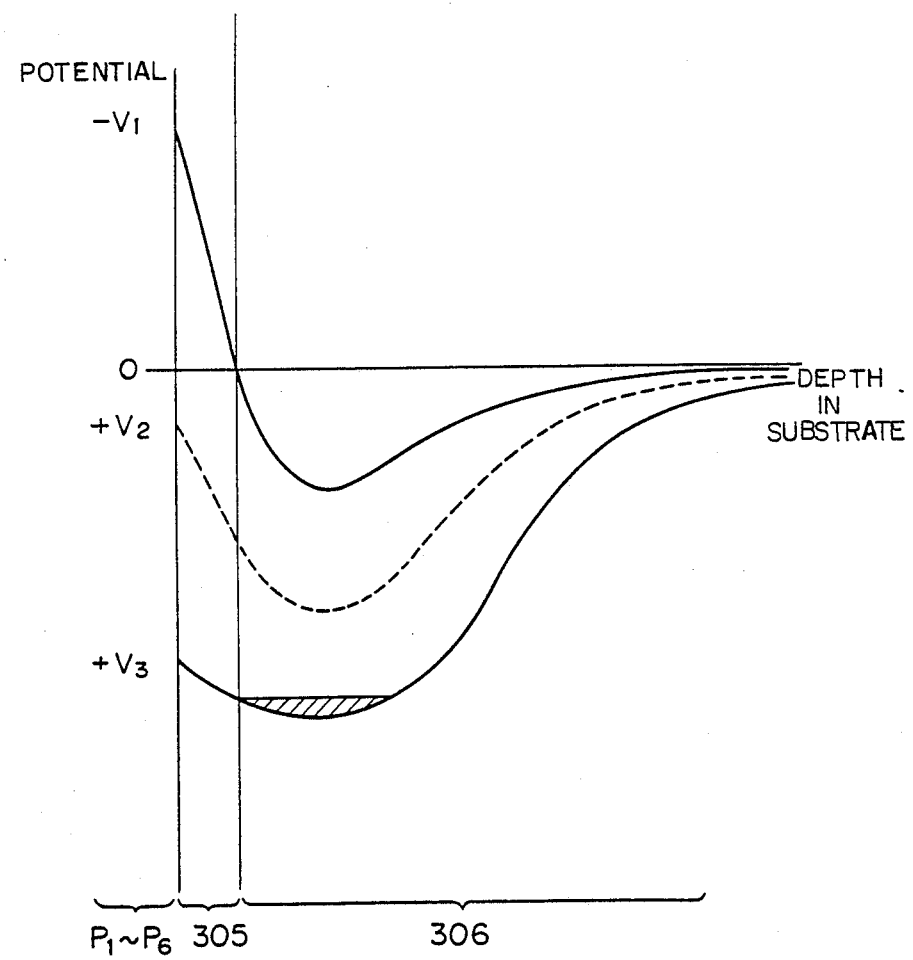
FIG. 8 is a diagram for explaining the charge recombination characteristic of the image pick-up device in the fourth embodiment shown in FIG. 7.

In FIG. 7, the same parts and elements as those shown in FIG. 6 are designated by the same reference numerals. In the diagram, the hatched portions CS where the oblique lines on the right side rise represent the channel stops, while the hatched portions 118 to 121 where the oblique lines on the right side fall indicate the transfer electrodes of each horizontal line sensor, and AB denotes charge recombination electrodes. A region ABW which is constituted such that the charges under the VW region of each line sensor can enter is provided under each electrode AB. The potential level in the substrate in each region ABW is varied as shown in FIG. 8 in dependence upon a voltage which is applied to the electrode AB. That is, FIG. 8 is a graph showing the states of the voltage applied to the electrode AB and of the potential level in the semiconductor substrate with respect to the direction of the thickness of a semiconductor substrate 306. As can be seen from the graph, the potential well is narrow for a high level electrode voltage $V_3$, so that the overflow carrier recombines with a majority carrier at the interface with an insulating layer 305.

On the contrary, in case of a low level electrode voltage $-V_1$, the accumulation state occurs, so that the majority carrier can be easily collected around the periphery of the interface and, for instance, the majority carrier is supplied from the channel stops CS. Thus, for example, by applying the voltage $-V_1$ to the electrodes 118 to 121, a barrier is formed and the charges are collected in the VW region. In this state, by alternately applying the voltages $-V_1$ and $V_3$ to the electrodes AB, the minority carrier which is stored under an electrode $P_1$ is limited to less than a predetermined amount.

As described above, in this embodiment, the charge recombination electrode is used as the charge draining part and each such electrode is provided between two rows of the pixels, so that the transfer efficiency of the line sensor is not affected.

Also, the horizontal resolution is not affected.

The resolution can be further raised since the position of each pixel is shifted horizontally by ½ of the pixel for every horizontal line similarly to the third embodiment.

On the other hand, although a certain area is needed as the recombination region to perform the charge recombination, a sufficient recombination efficiency can be obtained since the recombination region ABW is provided in the space between the horizontal line sensors in this embodiment. Also, the recombination region can be easily formed adjacent to the VW region. Moreover, since the recombination region is provided in the adjacent portion where it does not overlap with the VW region in this embodiment, the charge recombination electrode can be formed by the same manufacturing process as the transfer electrode, so that this contributes to improvement of the yield.

As described above, the image pick-up device of the invention can prevent the blooming without sacrificing the horizontal resolution as in the conventional image pick-up device. In addition, since the pitch of pixels in the horizontal direction can be made constant, the moire is unlikely to occur.

What is claimed is:
1. An area image pick-up device comprising:
 (a) a plurality of pixels arranged in row and column directions for performing a two-dimensional pho- toelectric conversion, said plurality of pixels photoelectrically converting an image;
(b) a plurality of charge eliminating means arranged in the row direction such that each of said charge eliminating means is provided for a plurality of pixel rows; and
(c) readout means for reading out an electrical signal of each of said pixels for every row, said readout means reading out electrical signals of the rows sequentially in predetermined order respectively in a television horizontal interval, the readout being accomplished by transferring pixel signals in the row direction.

2. An area image pick-up device according to claim 1, wherein said charge eliminating means drains overflow charges.

3. An area image pick-up device according to claim 2, wherein said charge eliminating means includes a drain for allowing the overflow charges to flow to a power source.

4. An area image pick-up device according to claim 1, wherein said charge eliminating means allows some of the charges formed in each pixel to be combined with the charges of the other polarity.

5. An area image pick-up device according to claim 1, wherein said readout means reads out the electrical signal of each pixel in a given one of said rows in accordance with a predetermined sequence, for each row.

6. An area image pick-up device according to claim 1, wherein each of said pixels constitutes a charge coupled device in the row direction.

7. An area image pick-up device comprising:
(a) a plurality of pixels arranged in row and column directions for performing a two-dimensional photoelectric conversion, said plurality of pixels constituting an area sensor and photoelectrically converting an area image;
(b) a plurality of charge eliminating means arranged in the row direction such that each one of said charge eliminating means is provided for a plurality of pixel rows;
(c) transfer means for respectively transferring electrical signals of said plurality of pixels in the row direction;
(d) a memory means connected to an end portion in a transfer direction, of said transfer means, for storing the electrical signals of said plurality of pixels, said memory means including a plurality of memory devices arranged in the row and column directions; and
(e) readout means for reading out contents of said memory means, said readout means sequentially reading out electrical signals of the rows of said memory means in a predetermined order respectively in a television horizontal interval, the readout being accomplished by transferring pixel signals in the row direction.

8. An area image pick-up device according to claim 7, wherein said charge eliminating means drains the overflow charges.

9. An area image pick-up device according to claim 8, wherein said charge eliminating means includes a drain for allowing the overflow charges to flow to a power source.

10. An area image pick-up device according to claim 7, wherein said charge eliminating means allows some of the charges formed in each pixel to be combined with the charges of the other polarity.

11. An area image pickup device according to claim 7, wherein said readout means reads out the contents of a row of the memory in accordance with a predetermined sequence.

12. An area image pick-up device according to claim 7, wherein said memory includes charge transfer devices of a plurality of rows which can transfer charges in the row direction.

13. An area image pick-up device comprising:
(a) an image pick-up part having a plurality of pixels arranged in row and column directions for performing a two-dimensional photo-electric conversion, said image pick-up part including transfer means for transferring in the row direction a signal of the pixels arranged in the row direction;
(b) a memory provided at a location which lies in the row direction of said image pick-up part, for storing electrical signals of said plurality of pixels, said memory being arranged adjacent to an end portion, in a transfer direction, of said transfer means;
(c) buffer means, provided between said image pick-up part and said memory, and buffer control signal generating means for generating transfer signals for transferring said electrical signals of said plurality of pixels to said memory, said transfer signals including first transfer signals for transferring said electrical signals of said plurality of pixels in said image pick-up part, second transfer signals for transferring said electrical signals in said buffer means, and third transfer signals for transferring said electrical signals in said memory means, wherein said first, second and third transfer signals have different respective frequencies from each other; and
(d) readout means for reading out contents of said memory, the readout being accomplished by transferring electrical signals in said memory in the row direction row-by-row respectively in a television horizontal interval.

14. An area image pick-up device according to claim 13, wherein said memory has memory devices arranged in the row and column directions.

15. An area image pick-up device according to claim 14, wherein said readout means sequentially reads out the contents of said memory for every row.

16. An area image pickup device according to claim 15, wherein said readout means reads out the contents of a row of the memory in accordance with a predetermined sequence.

17. An area image pick-up device according to claim 13, wherein said memory includes charge transfer devices of a plurality of rows which can transfer charges in the row direction.

18. An area image pick-up apparatus comprising:
(a) an image pick-up part having a plurality of pixels arranged in row and column directions for performing a two-directional photo-electric conversion, said image part including transfer means for transferring in the row direction a signal of the pixels arranged in the row direction;
(b) a memory provided at a location which lies in the row direction of said image pick-up part, for storing electrical signals of said plurality of pixels, said memory being arranged adjacent to an end portion, in a transfer direction, of said transfer means;
(c) readout means for reading out contents of said memory; and (d) control means for allowing the electrical signals of the pixels of all of said image pick-up part to be transferred in the row direction, said control means intermittently transferring a plurality of electrical signals of said image pick-up part to said memory means, wherein said plurality of electrical signals are transferred in a plurality of transfer operations each of which is performed at a predetermined first interval, and wherein the transfer of said plurality of electrical signals in said plurality of transfer operations is intermittently repeated at a predetermined second interval, the readout being accomplished by transferring pixel signals in the row direction row-by-row respectively in a television horizontal interval.

19. An area image pick-up apparatus according to claim 18, wherein said control means stops transfer during a predetermined interval after the signals of a predetermined plural number of pixels were transferred which the electrical signals of said pixels of all of the of said image pick-up part are transferred to the memory.

20. An area image pick-up apparatus comprising:
(a) an image pick-up part having a plurality of pixels arranged in row and column directions for performing a two-dimensional photo-electric conversion, said image pick-up part including transfer means for transferring in the row direction a signal of the pixels arranged in the row direction;
(b) a color filter arranged in front of said image pick-up part, said color filter having a repetitive cycle of different colors which differ at a predetermined period in the row direction;
(c) a memory provided at a location which lies in the row direction from said image pick-up part, for storing electrical signals of said plurality of pixels, said memory being arranged adjacent to an end portion, in a transfer direction, of said transfer means;
(d) readout means for reading out contents of said memory; and
(e) control means for allowing the electrical signals of said plurality of pixels to be intermittently transferred in the row direction at the period corresponding to said repetitive cycle in the row direction of said color filter and storing the electrical signals in memory, the readout being accomplished by transferring electrical signals in said memory in the row direction row-by-row respectively in a television horizontal interval.

21. An area image pick-up apparatus according to claim 20, wherein respective ones of said pixels correspond respectively to said different colors of said repetitive cycle of said color filter.

22. An area image pick-up apparatus according to claim 20, wherein, during transfer of the electrical signals of the pixels of all of said image pick-up part to said memory, said control means stops transfer of the electrical signals during a predetermined interval after the signals of pixels corresponding to one-period pattern in the row direction of said color filter have been transferred to said memory.

* * * * *

UNITED STATES PATENT AND TRADEMARK OFFICE
CERTIFICATE OF CORRECTION

PATENT NO. : 4,910,588

DATED : March 20, 1990

INVENTOR(S) : Kinoshita, et al

It is certified that error appears in the above-identified patent and that said Letters Patent is hereby corrected as shown below:

On the title page:

[56] REFERENCES CITED,
    Column 2, Line 1, change "weimer" to --Weimer--.

[57] ABSTRACT,
    Line 11, change "soo" to --so--.

COLUMN 1,
    Line 25, change "photo sensing surface" to --photosensing surface--; and
    Line 41, change "or like," to --or the like,--.

COLUMN 2,
    Line 25, change "s" to --a--.

COLUMN 3,
    Line 2, change "maya" to --may--.

COLUMN 5,
    Lines 9 and 11, close up left margin.

UNITED STATES PATENT AND TRADEMARK OFFICE
CERTIFICATE OF CORRECTION

PATENT NO. : 4,910,588

DATED : March 20, 1990

INVENTOR(S) : Kinoshita, et al

It is certified that error appears in the above-identified patent and that said Letters Patent is hereby corrected as shown below:

COLUMN 7,
   Line 17, change "predetermine" to --predetermined--; and
   Line 29, change "applied." to --applied--.

COLUMN 11,
   Line 20, change "which" to --when--; and delete "the of".

Signed and Sealed this

Twenty-seventh Day of August, 1991

Attest:

HARRY F. MANBECK, JR.

Attesting Officer

Commissioner of Patents and Trademarks